United States Patent
Goo et al.

(10) Patent No.: US 9,601,648 B2
(45) Date of Patent: Mar. 21, 2017

(54) METHOD OF MANUFACTURING PATTERN USING TRENCH STRUCTURE AND PATTERN MANUFACTURED THEREBY, AND METHOD OF MANUFACTURING SOLAR BATTERY USING THE MANUFACTURING METHOD AND SOLAR BATTERY MANUFACTURED THEREBY

(71) Applicant: LG CHEM, LTD., Seoul (KR)

(72) Inventors: Yong-Sung Goo, Daejeon (KR); Joon-Hyung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 323 days.

(21) Appl. No.: 14/378,228

(22) PCT Filed: Apr. 15, 2014

(86) PCT No.: PCT/KR2014/003252
§ 371 (c)(1),
(2) Date: Aug. 12, 2014

(87) PCT Pub. No.: WO2014/171708
PCT Pub. Date: Oct. 23, 2014

(65) Prior Publication Data
US 2016/0254399 A1  Sep. 1, 2016

(30) Foreign Application Priority Data

Apr. 15, 2013 (KR) .................. 10-2013-0041234
Apr. 15, 2014 (KR) .................. 10-2014-0044724

(51) Int. Cl.
*H01L 31/02* (2006.01)
*H01L 31/068* (2012.01)
*H01L 31/18* (2006.01)
*H01L 31/0224* (2006.01)

(52) U.S. Cl.
CPC .... *H01L 31/068* (2013.01); *H01L 31/022425* (2013.01); *H01L 31/1804* (2013.01); *Y02E 10/50* (2013.01); *Y02P 70/521* (2015.11)

(58) Field of Classification Search
CPC .......... H01L 31/068; H01L 31/022425; Y02P 70/521; Y02P 10/50
See application file for complete search history.

(56) References Cited

U.S. PATENT DOCUMENTS

| 2004/0171255 | A1 | 9/2004 | Roth |
| 2006/0105492 | A1 | 5/2006 | Veres et al. |
| 2011/0120531 | A1 | 5/2011 | Nese et al. |
| 2011/0177651 | A1* | 7/2011 | Mingirulli ............ C09D 11/34 438/98 |

(Continued)

FOREIGN PATENT DOCUMENTS

| KR | 10-2007-0067875 A | 6/2007 |
| KR | 1020070076292 | 7/2007 |

*Primary Examiner* — Bac Au
(74) *Attorney, Agent, or Firm* — Dentons US LLP

(57) ABSTRACT

The present disclosure provides a method of manufacturing a pattern including: forming a trench structure on a substrate using an inkjet method; filling an interior portion of the trench structure with a filler; and removing the trench structure, and a pattern manufactured using the same, and a method of manufacturing a solar battery using the method of manufacturing a pattern and a solar battery manufactured using the same.

13 Claims, 9 Drawing Sheets

(56) References Cited

U.S. PATENT DOCUMENTS

| | | |
|---|---|---|
| 2011/0207328 A1 | 8/2011 | Speakman |
| 2012/0052191 A1 | 3/2012 | Fork et al. |
| 2012/0132273 A1 | 5/2012 | Lee et al. |
| 2012/0285527 A1 | 11/2012 | Goldblatt et al. |

* cited by examiner (a)

(b)

(a)

(b)

(a)

(b)

(c)

METHOD OF MANUFACTURING PATTERN USING TRENCH STRUCTURE AND PATTERN MANUFACTURED THEREBY, AND METHOD OF MANUFACTURING SOLAR BATTERY USING THE MANUFACTURING METHOD AND SOLAR BATTERY MANUFACTURED THEREBY

This application is a 35 USC §371 National Stage entry of International Application No. PCT/KR2014/003252, filed on Apr. 15, 2014, which claims priority from Korean Patent Application Nos. 10-2013-0041234, filed on Apr. 15, 2013 and 10-2014-0044724, filed on Apr. 15, 2014, in the Korean Intellectual Property Office, all of which are incorporated herein by reference in their entirety.

TECHNICAL FIELD

The present disclosure relates to a method of manufacturing patterns having various shapes with a desired width and thickness and a pattern manufactured using the same, and a method of manufacturing a solar battery using the manufacturing method of the pattern and a solar battery manufactured using the same.

BACKGROUND ART

Methods of forming patterns commonly used in the related art may include a photolithography method, an imprint lithography method, a roll printing method, and the like.

The photolithography method is a method of manufacturing a pattern by forming a photoresist layer on a substrate and subsequently, performing exposure and development processes on photoresist layer. In the method, a circuit line width or a pattern line width may be determined due to a wavelength of light used in the exposure process. However, in consideration of the state of current technology, in the case of the photolithography method, it may be difficult to form a fine pattern on a substrate due to the interruption of light. Further, in order to form a micro-fine pattern, the initial investment costs for purchasing expensive exposure equipment and the like may be increased, and the price of high resolution masks has rapidly increased, thereby leading to the deterioration of efficiency in manufacturing costs. In addition, every time the pattern is formed, it may be necessary to perform an exposure process, a baking process subsequent to the exposure process, a development process, a baking process subsequent to the development process, an etching process, a cleansing process, and the like. Thus, since a relatively long processing time may be required and multiple photo processes need to be repeated, problems such as deteriorations in productivity may be encountered.

The imprint lithography method is a method initially developed by Stephen Y. Chou at Princeton University, in order to imprinting a nanoscale pattern. In the method, a desired shape is fabricated in advance on a surface of an inorganic surface or a polymer having relatively high strength. The shape is subsequently stamped on another material, thereby forming a pattern. In more detail, the imprint lithography method is a method of attaching an inorganic or polymer mold provided with a desired pattern to a curable composition coated on a metal film or an organic film and then applying heat thereto, or performing a photo-curing process thereon, to thereby form a pattern. As compared to the photolithography method, the imprint lithography method may allow for a simple process and may be advantageous in forming a fine pattern.

The roll printing method is concretely disclosed in Korean Patent Laid Open Publication No. 2007-0076292 (Jul. 24, 2007). In the rolling printing method, a direct pattern transfer may be formed on a substrate on which fine patterns will be formed, using a silicone polymer and a cliché, instead of a high solution mask used in the formation of patterns in existing photolithography processes. In the roll printing method, a silicone polymer may be used as a stamp to improve alignments and releasability with a mold, and a thermosetting process may be used to increase productivity and operation efficiency. In addition, the roll printing method has been proposed as an alternative method capable of dramatically simplifying and reducing the complexity of several processes such as exposure and development processes, and the like in the photolithography method, and correspondingly caused additional processing costs.

However, in the case of the photolithography method, the imprint lithography method, and the roll printing method according to the related art, in forming a pattern having a desirable width and thickness, for example, a fine pattern having a high aspect ratio, limitations may be present in terms of ease of manufacturing, precision of formed patterns, and easy repeatability of a pattern formation process. Thus, the development of a novel method of forming various patterns having a desired width and thickness is required.

DISCLOSURE

Technical Problem

An aspect of the present disclosure provides a method of manufacturing patterns having various shapes with a desired width and thickness and a pattern manufactured using the same, for example, a fine pattern having a high aspect ratio using the method of manufacturing the pattern. Further, an aspect of the present disclosure also provides a method of manufacturing a solar battery, including the manufacturing method of the pattern, and a solar battery manufactured using the same.

Technical Solution

According to an aspect of the present disclosure, a method of manufacturing a pattern may include: forming a trench structure on a substrate; filling an interior portion of the trench structure with a filler; and removing the trench structure, wherein the trench structure is formed by an inkjet method, using hot melt ink.

In this case, the trench structure may be composed of a plurality of printing patterns for forming a trench structure.

In addition, a ratio of an internal height to an internal width of the trench structure may be 6:1 to 1:10.

Meanwhile, the hot melt ink may be a thermoplastic hot melt ink or an UV curable hot melt ink.

Meanwhile, the filler may include a conductive material containing one or more selected from a group consisting of silver (Ag), copper (Cu), aluminum (Al), indium tin oxide (ITO), gold (Au), nickel (Ni), carbon nanotubes (CNT) and poly(3,4-ethylenedioxythiophene) (PEDOT), or an insulating material containing one or more selected from a group consisting of acrylate, urethane, polyimide and epoxy resin.

Meanwhile, the removing of the trench structure may include one or more selected from a group consisting of a thermal treatment process and a solution treatment process.

According to another aspect of the present disclosure, a pattern manufactured by the method of manufacturing a pattern described above may also be provided.

According to another aspect of the present disclosure, a method of manufacturing a solar battery may include forming a dopant layer on a substrate; forming a trench structure on the dopant layer; etching the dopant layer; filling an interior portion of the trench structure with a filler; and removing the trench structure, wherein the trench structure is formed by an inkjet method, using hot melt ink.

In this case, the trench structure may be composed of a plurality of printing patterns for forming a trench structure.

In addition, a ratio of an internal height to an internal width of the trench structure may be 6:1 to 1:10.

Meanwhile, the substrate may be a silicon wafer.

Meanwhile, the hot melt ink may be a thermoplastic hot melt ink or an UV curable hot melt ink.

Meanwhile, the filler may include a conductive material containing one or more selected from a group consisting of silver (Ag), copper (Cu), aluminum (Al), indium tin oxide (ITO), gold (Au), nickel (Ni), carbon nanotubes (CNT) and poly(3,4-ethylenedioxythiophene) (PEDOT).

Meanwhile, the method of manufacturing a solar battery may further include forming a reflection prevention layer on the substrate, after the etching of the dopant layer.

According to another aspect of the present disclosure, a solar battery manufactured by the method of manufacturing a solar battery may also be provided.

Advantageous Effects

In a method of manufacturing a pattern according to an exemplary embodiment of the present disclosure, various shapes of patterns having a desired width and thickness may be manufactured, and a fine pattern having a high aspect ratio may also be manufactured.

In the case of using the method of manufacturing a pattern in a method of manufacturing a solar battery, since a fine line width of an electrode may be enabled and an aspect ratio of the electrode may be increased, a light receiving area may be significantly increased, such that a solar battery having high efficiency may be obtained.

BEST MODE

Figure 1:
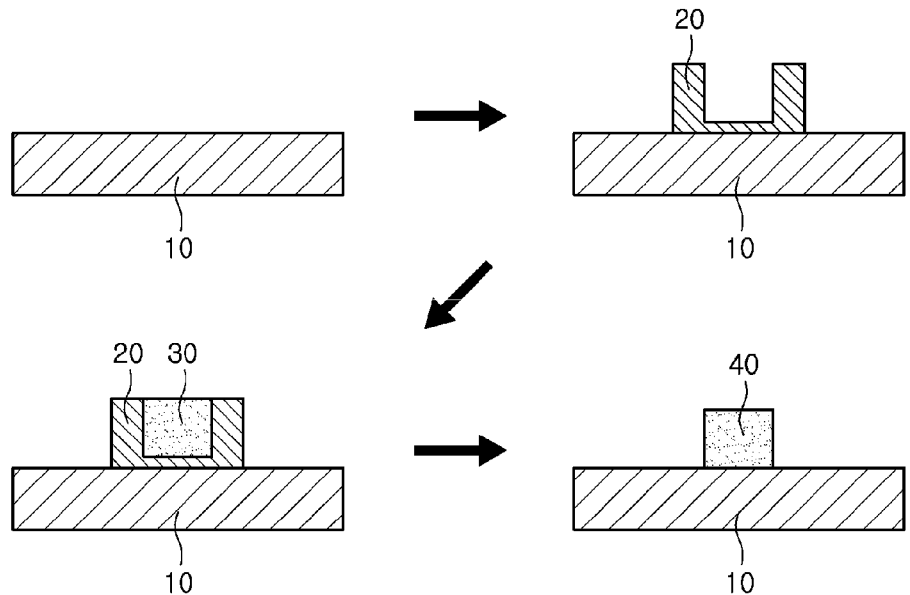
FIG. 1 is a conceptual view illustrating a method of manufacturing a pattern according to an exemplary embodiment of the present disclosure.

Hereinafter, exemplary embodiments of the present disclosure will now be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

First, a method of manufacturing a pattern according to an exemplary embodiment of the present disclosure will be described.

As illustrated in FIG. 1, the method of manufacturing a pattern according to an exemplary embodiment of the present disclosure may include: forming a trench structure 20 on a substrate 10; filling an interior portion of the trench structure 20 with a filler 30; and removing the trench structure 20. In this case, the trench structure 20 may be formed by an inkjet method using hot melt ink.

First, a material for the substrate 10 according to an exemplary embodiment of the present disclosure is not particularly limited, as long as the material has frictional or adhesive force. For example, substrates formed of various materials such as silicon, glass, paper, a copper film, and the like may be used without limitation. Meanwhile, among these, a silicone substrate may have unevenness on a surface thereof.

Next, the trench structure 20 according to an exemplary embodiment of the present disclosure basically refers to a structure including a wall surface. An exemplary embodiment of the present disclosure is characterized by forming the trench structure 20 in an inkjet method using hot melt ink.

In the case of forming the trench structure 20 using hot melt ink, as in the exemplary embodiment of the present disclosure, the following advantages may be provided. First, hot melt ink, a thermoplastic material having non-volatile properties of 100% and present in a solid state containing no water or solvents at room temperature, may have fluidity when heat is applied thereto to a melting point thereof. In a case in which the hot melt ink is coated and left on a subject and subsequently, is cooled, the hot melt ink may be solidified within a few minutes. In addition, in the case that the ink is present under ink-jettable viscosity conditions by heating a reservoir and a head of an inkjet device, the ink may be discharged and then rapidly solidified after the discharge thereof. Thus, regardless of a type of the substrate 10, printing patterns 2 for forming a trench structure may be formed, the printing patterns 2 having a dot shape, a linear shape or a surface shape. Since one printing pattern 2 for forming a trench structure may be overlapped and formed on another printing pattern 2 for forming a trench structure, multiple layers of the printing patterns 2 for forming the trench structure 20 may be jetted to thereby form wall surfaces of the trench structure 20.

In addition, in a case in which the trench structure 20 is formed using hot melt ink, the printing patterns 2 may have acid resistance and accordingly, the trench structure 20 may function as an etch resist. The etch resist may have chemically resistant properties against an acid solution such as a sulfuric acid solution, a hydrofluoric acid solution or the like. Thus, even in the case of acid treatment, the trench structure 20 may remain.

Further, in a case in which the trench structure 20 is formed using hot melt ink, the printing patterns 2 for forming the trench structure 20 may have stripping properties and accordingly, they may be easily removed, such that a pattern 40 having a desired shape depending on the field of application may be easily obtained.

Furthermore, in a case in which the trench structure 20 is formed using hot melt ink, the process of forming the trench structure 20 may be performed under temperature conditions lower than the melting point of the hot melt ink, for example, temperature conditions equal to or higher than 15° C. but lower than 80° C., or an additional drying process may be performed as necessary. In this manner, since the process of forming the trench structure 20 and if necessary, the additional drying process may be repeatedly performed under relatively warm temperature conditions, efficiency and accuracy in processes may be increased, such that a fine pattern 40 may be obtained within a tolerance range.

Meanwhile, a type of hot melt ink usable in exemplary embodiments of the present disclosure is not particularly limited and for example, may be a thermoplastic hot melt ink or an UV curable hot melt ink. In the case of using the thermoplastic hot melt ink, the thermoplastic hot melt ink is melt at a predetermined temperature or more due to thermoplastic properties thereof in which the ink is melt at the time of applying heat thereto, while a state of the ink is returned to a solid state at a sufficiently low temperature. Thus, removal of the printing patterns 2 for forming the trench structure may be facilitated. And, since the UV curable hot melt ink may have superior heat resistance as compared to a non-UV curable hot melt ink, it may be usefully used in fields requiring a high temperature process. Specifically, in a case in which the non-UV curable hot melt ink is processed under temperature conditions equal to or higher than about 80° C., the melting point of the hot melt ink, defects in which a shape of the printing patterns 2 for forming the trench structure 20 collapses may occur. However, in the case of using the UV curable hot melt ink, a shape of the trench structure 20 may not be fluidly changed even under a high temperature process of 80° C. or more.

In addition, in a case in which the trench structure 20 is formed using an inkjet method as in the exemplary embodiment of the present disclosure, since the inkjet method is performed in a non-contact scheme, the possibility that the shape of the trench structure 20 may be damaged may be lowered, as compared to the case of a contact scheme.

Figure 3:
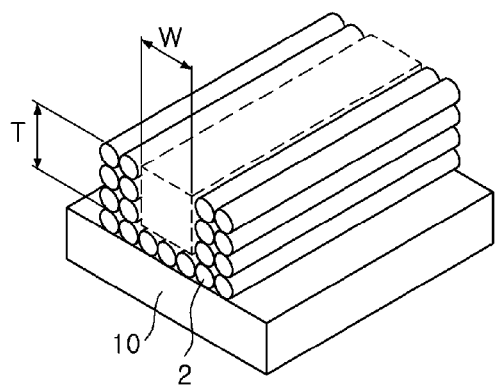
FIGS. 3A and 3B are cross-sectional views of trench structures according to an exemplary embodiment of the present disclosure.
Figure 3:
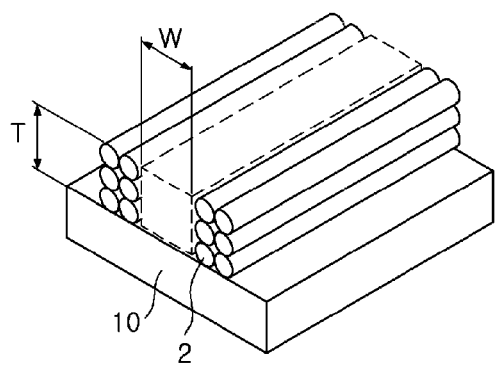

Meanwhile, in a case in which the trench structure 20 is formed using hot melt ink as described above, the trench structure 2 may be composed of a plurality of the printing patterns 2 for forming the trench structure, as illustrated in FIGS. 3(a) and 3(b). In the exemplary embodiment of the present disclosure, since the trench structure 20 may be composed of the plurality of printing patterns 2 for forming the trench structure, a width and a depth of a trough in the trench structure 20 may be easily controlled depending on the number of lines and the number of layers of the printing patterns 2 for forming the trench structure. Thus, various patterns having desirable widths and thicknesses may be formed and in particular, a fine pattern having a high aspect ratio may be formed.

In this case, "the number of lines" indicates the number of printing patterns 2 for forming the trench structure, configuring a lowest bottom surface of the trench structure 20 (but, it is limited to a case in which the bottom surface of the trench structure 20 is formed of the printing patterns 2 for forming the trench structure), for convenience of explanation. "The number of layers" indicates the number of the printing patterns 2 for forming the trench structure, configuring an outermost wall surface of the trench structure 20 (an outermost surface of wall surfaces of the trench structure 20), for the convenience of explanation. For example, in the following FIG. 3(a), the number of the printing patterns 2 for forming the trench structure, configuring the bottom surface of the trench structure 20 may be 7 and the number of the printing patterns 2 for forming the trench structure, configuring the outermost wall surface of the trench structure 20 may be 4. Thus, it could be said that the trench structure 20 of FIG. 3(a) may have seven lines and four layers.

Meanwhile, the trench structure 20 of FIG. 3(a) is provided as an illustrative example in which the bottom surface thereof is separately formed of the printing patterns 2 for forming the trench structure. FIG. 3(b) corresponds to an illustrative example in which the bottom surface formed of the printing patterns 2 for forming the trench structure is not separately formed and the substrate 10 itself is employed as the bottom surface of the trench structure 20. In this manner, the trench structure 20 according to the exemplary embodiment of the present disclosure may have the bottom surface separately formed of the printing patterns 2 for forming the trench structure. Alternatively, the bottom surface formed of the printing patterns 2 for forming the trench structure is not separately formed and the substrate 10 itself is employed as the bottom surface of the trench structure 20. However, a case in which a bottom surface separately formed of the printing patterns 2 for forming the trench structure is present on the substrate 10 may be advantageous in terms of the prevention of etching of the substrate 10.

Meanwhile, in the trench structures 20 of FIGS. 3(a) and 3(b), the printing patterns 2 for forming the trench structure may be implemented to have linear shapes, but the implementation is merely provided by way of example and the present disclosure is not limited thereto. That is, as necessary, the printing patterns 2 for forming the trench structure may be jetted to have linear shapes and/or curved shapes, such that the pattern 40 intended to be finally obtained and an electrode 40' to be described later may be freely implemented in a dot shape, a linear shape and a surface shape.

Meanwhile, an internal width W of the trench structure 20 is not particularly limited and may be, for example, about 10 μm to 2000 μm. However, in a case in which the internal width W is excessively large, the formation of a fine pattern may be difficult, while in a case in which the internal width W is excessively narrow, the securing of an internal space capable of being filled with the filler 30 at the time of filling the filler 30 using an inkjet method may be difficult.

In addition, an internal height T of the trench structure 20 is neither particularly limited and may be, for example, about 0.5 μm to 1000 μm. However, in a case in which the internal height T is excessively great, a pattern shape may collapse at the time of removing the trench structure 20 after the filling of the filler 30, while in a case in which the internal height T is excessively low, the formation of a pattern having a high aspect ratio may be difficult.

Meanwhile, a ratio of the internal height T to the internal width W of the trench structure 20 may be about 6:1 to 1:10. When the ratio is equal to or higher than 6:1 but lower than 2:1, the pattern 40 having a relatively large line width as compared to a thickness thereof may be finally obtained, which may be advantageous in forming the pattern 40 having superior adhesion with respect to the substrate and a small thickness. In addition, when the ratio is equal to or higher than 2:1 but lower than 1:3, the pattern 40 having a line width and a thickness thereof that are similar to each other may be finally obtained, and the formed pattern 40 may be relatively stably maintained. In addition, when the ratio is in a range equal to or more than 1:3 to equal to or less than 1:10, the pattern 40 having a relatively large thickness as compared to a line width thereof may be finally obtained, which may be advantageous in manufacturing the pattern 40 having a significantly high aspect ratio.

Meanwhile, in a case in which a height of the wall surface of the trench structure 20 is excessively high (for example, a case in which the number of layers thereof is 6 or more), since adhesion between the printing patterns 2 for forming the trench structure and the substrate 10 may be lowered, thereby causing limitations on the formation of the structure. Thus, in order to complement this, the printing patterns 2 for forming the trench structure may be continuously formed in an inward direction from the outermost wall surface of the trench structure 20, such that a first wall surface composed of two or more lines of printing patterns may be formed. Further, in response to the first wall surface, a second wall surface opposed to the first wall surface and configuring the trench structure 20 together with the first wall surface may be formed. With regard thereto, the same configuration as described above may be applied.

Figure 4:
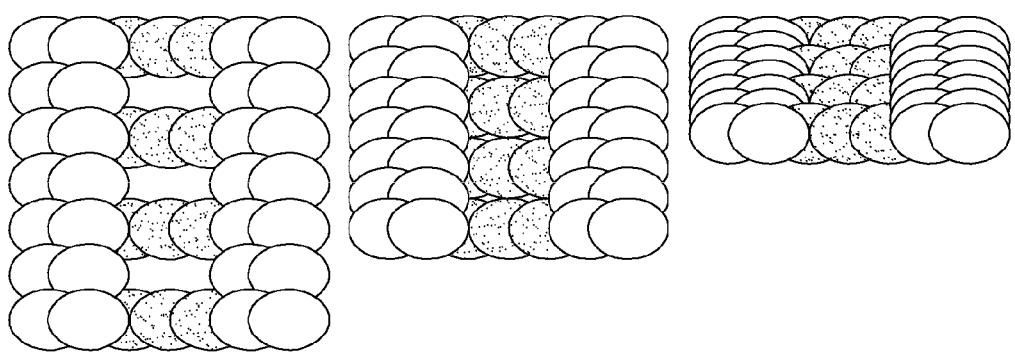
FIG. 4 is a conceptual view illustrating an adjustment of an interval between dots of patterns for forming a trench structure according to an exemplary embodiment of the present disclosure.

Meanwhile, in the trench structure 20, the wall surfaces may be formed through a separate pattern printing process after the formation of the bottom surface. Furthermore, the bottom surface and the wall surfaces may be formed in a single pattern printing process by adjusting an interval between dots of the printing patterns 2 for forming the trench structure. In this case, the interval between dots may be adjusted by changing dots per inches (DPI) using an encoder. Described with reference to FIG. 4, voids are present in the initial pattern image (see a left pattern image of FIG. 4). However, when the interval between dots is set in order to fill the voids present in the pattern image using an encoder (see a middle pattern image and a right pattern image of FIG. 4), the interval between dots of the printing patterns 2 for forming the trench structure may be further reduced and the dots of the printing patterns 2 may be more densely formed. In this case, an image of a pattern having a further increased thickness through a single pattern printing process may be obtained.

Meanwhile, when the trench structure 20 according to the exemplary embodiment of the present disclosure is applied to a practical pattern formation process, the trench structure 20 may be formed by an inkjet printing device in which several nozzles are arranged at predetermined intervals. For example, one or more trench structures 20 may be continuously arranged by a scheme of performing control such that ink is no longer discharged from a nozzle disposed in a position corresponding to the width of the trough in the trench structure 20 after the printing patterns 2 for forming the trench structure, configuring the bottom surface of the trench structure 20 are jetted, and then, repeatedly jetting the printing patterns 2 for forming the trench structure, configuring the wall surface of the trench structure 20 to form multiple layers of wall surfaces. Through such a scheme, a large area pattern having a desired shape may be manufactured.

Then, when the trench structure 20 is formed on the substrate 10, an interior portion of the trench structure 20 may be filled with the filler 30. In this case, as the filler 30 filling the interior portion of the trench structure 20, various types of materials may be used depending on the field of application without limitations, as long as they allow a solvent of the filler to be dried at a temperature lower than the melting point of the hot melt ink used in the forming of the trench structure 20.

For example, the filler 30 may include a conductive material containing one or more selected from a group consisting of silver (Ag), copper (Cu), aluminum (Al), indium tin oxide (ITO), gold (Au), nickel (Ni), carbon nanotubes (CNT) and poly(3,4-ethylenedioxythiophene) (PEDOT), or an insulating material containing one or more selected from a group consisting of acrylate, urethane, polyimide and epoxy resin.

As a method of filling the interior portion of the trench structure 20 with the filler 30, various printing methods such as a screen printing method, an inkjet printing method, a dispensing method and the like, which are generally used, may be used. However, the present disclosure is not limited thereto, and any method capable of filling the trough of the trench structure may be used without particular limitations.

Meanwhile, after filling the interior portion of the trench structure 20 with the filler 30, a process of drying the trench structure 20 may be performed, if necessary. In this case, a dry temperature may be variously changed depending on the solvent configuring the filler 30. For example, in a case in which a high volatile material having a boiling point lower than 100° C. is used as the solvent configuring the filler 30, the trench structure 20 may be dried at a temperature of 50° C. to 60° C. for about 10 minutes. Meanwhile, in a case in which a material having a boiling point equal to or higher than 100° C. is used as the solvent configuring the filler 30, the interior of the trench structure 20 may be filled with the filler 30 containing the solvent after forming the trench structure 20 using an UV curable hot melt ink and then, the drying process may be performed at a temperature of 80° C. or more. Meanwhile, depending on a height and a filling ratio of the filler 30 filling the interior of the trench structure 20, an additional process of filling the filler 30 and an additional drying process may be further performed after the drying process.

Then, after filling the interior portion of the trench structure 20 with the filler 30, the trench structure 20 may be removed. Through the removal process of the trench structure 20, the pattern 40 may be formed on the substrate 10.

Meanwhile, the removal process of the trench structure 20 may include one or more selected from a group consisting of a thermal treatment process and a solution treatment process. In this case, a thermal treatment temperature of the thermal treatment process may be higher than a boiling point of a material forming the printing patterns 2 for forming the trench structure 20. For example, the thermal treatment process may be performed at a high temperature of 350° C. or more. And, the solution treatment process may be performed using a solution containing alcohol such as ethanol, isopropyl alcohol or the like and/or an organic solvent such as dimethylsulfoxide (DMSO), dimethylformamide (DMF) or the like. For example, the trench structure 20 may be removed using isopropyl alcohol at a temperature of 50° C. to 60° C. The isopropyl alcohol may be relatively inexpensive and have a low boiling point to be rapidly dried, thereby facilitating subsequent processes.

Meanwhile, the removal process of the trench structure 20 may be performed within several seconds to several hundred seconds, but is not limited thereto. For example, the removal process of the trench structure 20 may be performed at a temperature of 50° C. to 60° C. within 1 second to 120 seconds.

Meanwhile, an exemplary embodiment of the present disclosure may also provide the pattern 40 manufactured through the method of manufacturing a pattern described above. The pattern 40 may have a dot shape, a linear shape or a surface shape. The pattern 40 may be a fine pattern having a high aspect ratio. In an exemplary embodiment of the present disclosure, a line width of the pattern 40 may be used to have the same meaning as a width of the pattern 40.

Meanwhile, the line width and a thickness of the pattern 40 may correspond to the internal width W and the internal height T of the trench structure 20, respectively, but matching degrees of values thereof may be varied within a tolerance range. This is due to the fact that while the trough of the trench structure 20 may be measured by, for example, an alpha step (a-step) method and a 3D optical profiler, a difference in numerical value may be caused between the line width of the pattern 40 and the internal width W of the trench structure 20 within a tolerance range, and a difference in numerical value may be caused between the thickness of the pattern 40 and the internal height T of the trench structure 20 within a tolerance range.

Then, a method of manufacturing a solar battery using the method of manufacturing a pattern according to an exemplary embodiment of the present disclosure will be described.

Figure 2:
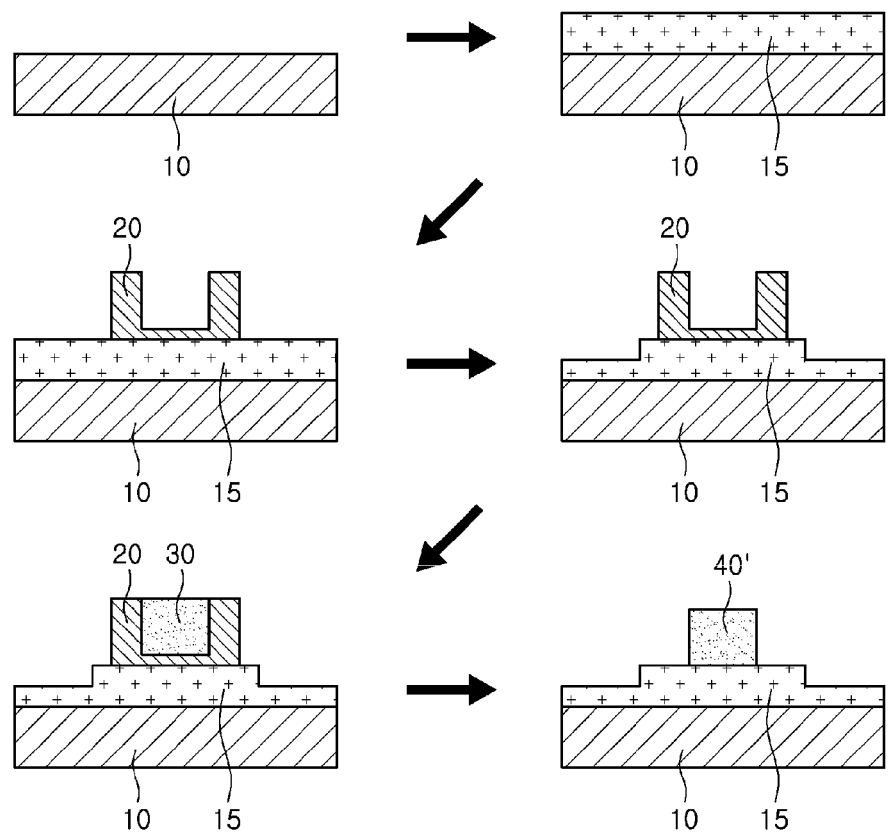
FIG. 2 is a conceptual view illustrating a method of manufacturing a solar battery according to an exemplary embodiment of the present disclosure.

As illustrated in FIG. 2, the method of manufacturing a solar battery according to an exemplary embodiment of the present disclosure may include: forming a dopant layer 15 on the substrate 10; forming the trench structure 20 on the dopant layer 15; etching the dopant layer 15; filling the interior portion of the trench structure 20 with the filler 30; and removing the trench structure 20. In this case, the trench structure 20 may be formed by an inkjet method using hot melt ink.

First, as a material of the substrate 10, any material may be used without particular limitations, as long as the material may have frictional or adhesive force sufficient to form the electrode 40' on the substrate 10. For example, the substrate 10 may be formed of silicon, glass, paper, a copper film or the like.

Figure 5:
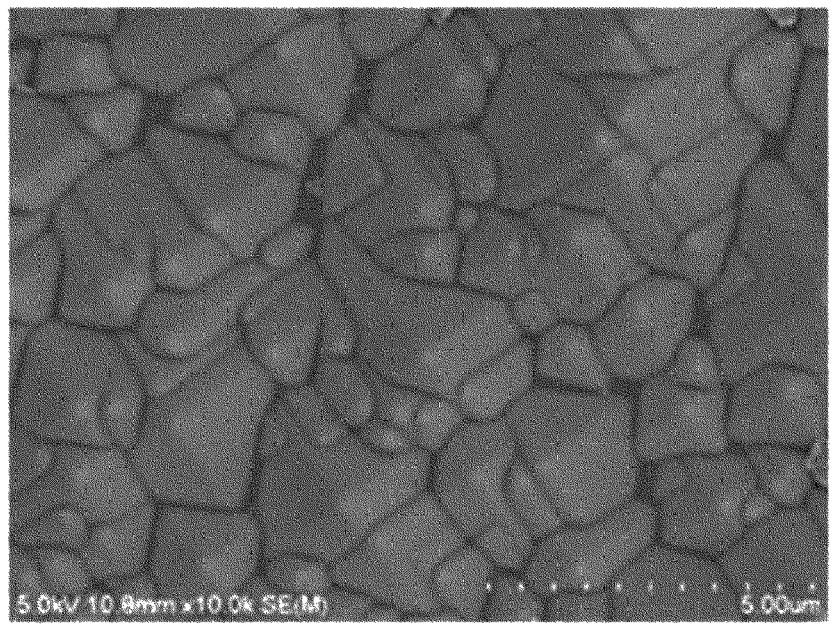
FIGS. 5(*a*) and 5(*b*) are images illustrating a surface and a cross-section of a silicon wafer having unevenness, usable in the method of manufacturing a pattern according to an exemplary embodiment of the present disclosure.
Figure 5:
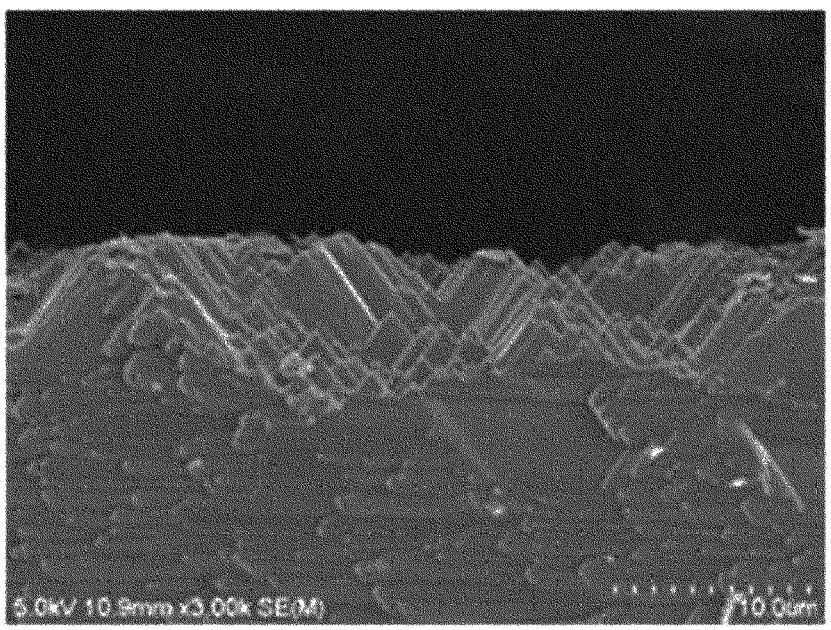

More preferably, the substrate 10 may be a silicon wafer, for example, a silicon wafer having unevenness on a surface thereof. FIG. 5(a) is an image illustrating a surface of a silicon wafer having unevenness, which may be used as the substrate 10. FIG. 5(b) is an image illustrating a cross-section of the silicon wafer having unevenness. In the images of FIGS. 5(a) and(b), a form in which pyramid shapes having heights of about 7 µm to 8 µm were randomly formed at intervals of 3 µm to 5 µm is observed. With the method of manufacturing a solar battery according to an exemplary embodiment of the present disclosure, even in a case in which the silicon wafer having unevenness on the surface thereof is used, a spreading phenomenon of the pattern 40 may not occur. Thus, a surface shape of the substrate 10 may not be highly constrained.

Meanwhile, in the forming of the dopant layer 15 on the substrate 10, a thermal diffusion method, an ion implantation method and the like, commonly used in the technical field to which the present disclosure pertains, may be used, and the present disclosure is not limited thereto. In this case, the solar battery may basically have a semiconductor P-N junction structure, and methods of forming such a P-N junction may be largely classified as the thermal diffusion method and the ion implantation method. Describing a method of forming an n-type semiconductor layer on a p-type silicon substrate using these methods, the thermal diffusion method is a method of forming a P-N junction by heating the p-type silicon substrate and infiltrating a phosphorus (P) element into the substrate from a surface thereof to allow a surface layer of the substrate to have a p-type polarity, and the ion implantation method is a method of forming a P-N junction by accelerating a phosphorus (P) element by an electric field after ionizing the phosphorus (P) element in a vacuum state and then, placing the accelerated phosphorus (P) element in a surface of the p-type silicon substrate to allow a surface layer of the substrate to have an n-type polarity.

Meanwhile, a method of forming a bonding layer for the solar battery using the thermal diffusion method is not limited to, but may be, for example, a method using a rapid thermal process (RTP) device, an emitter etch-back method, a selective emitter method or the like. In the exemplary embodiment of the present disclosure, these methods may be used without particular limitations in order to form the dopant layer 15. In this case, the method using the rapid thermal process (RTP) device may be a method of thermally expanding phosphorus and aluminum simultaneously on a front surface and a rear surface of a silicon substrate, respectively, by using the rapid thermal process (RTP) device and subsequently, maintaining the bulk lifetime of carriers through control of a cooling rate to thereby selectively control a depth of a diffused region. In addition, the emitter etch-back method is a method of forming an emitter layer through a diffusion process on condition of excessive impurity doping and subsequently, performing wet etching using a mixture solution of a nitric acid and a hydrofluoric acid or performing $CF_4$ plasma etching to thereby remove a dead layer adversely affecting functions of the solar battery. In addition, the selective emitter method may be a method of forming a mask pattern on a point on which a front electrode will be formed, so as not to etch n-type impurities on a surface of an emitter layer.

Then, after the dopant layer 15 is formed, the trench structure 20 may be formed on the dopant layer 15 by an inkjet method using hot melt ink. In the exemplary embodiment of the present disclosure, the trench structure 20 may be formed by an inkjet method using hot melt ink as described above, and correspondingly formed advantages may be identical to those as described above.

In addition, as described above, a type of hot melt ink usable in exemplary embodiments of the present disclosure is not particularly limited and for example, may be a thermoplastic hot melt ink or an UV curable hot melt ink.

In addition, as described above, the trench structure 20 formed by a printing method using the hot melt ink may be composed of the plurality of printing patterns 2 for forming the trench structure.

In addition, as described above, the internal width W and the internal height T of the trench structure 20 are not particularly limited and for example, the internal width W may be about 10 µm to 200 µm and the internal height T may be about 0.5 µm to 100 µm. The ratio of the internal height T to the internal width W of the trench structure 20 may be about 6:1 to 1:10. When the ratio is equal to or higher than 6:1 but lower than 2:1, the electrode 40' having a relatively large line width as compared to a thickness thereof may be finally obtained, which may be advantageous in forming the electrode 40' having superior adhesion with respect to the substrate and a small thickness. In addition, when the ratio is equal to or higher than 2:1 but lower than 1:3, the electrode 40' having a line width and a thickness thereof that are similar to each other may be finally obtained, such that the correspondingly formed electrode 40' may be relatively securely maintained. In addition, when the ratio is in a range equal to or more than 1:3 to equal to or less than 1:10, the electrode 40' having a significantly high ratio of a thickness to a line width thereof may be obtained, which may be advantageous in manufacturing the electrode 40' having a significantly high aspect ratio.

In addition, as described above, in order to complement defects in which the height of the wall surface is excessively high, the printing patterns 2 for forming the trench structure may be continuously formed in an inward direction from the outermost wall surface of the trench structure 20, such that a wall surface composed of two or more lines of printing patterns 2 may be formed.

In addition, as described above, the bottom surface and the wall surfaces may be formed in a single pattern printing process by adjusting an interval between dots of the printing patterns 2 for forming the trench structure.

In addition, as described above, when the trench structure 20 according to the exemplary embodiment of the present disclosure is applied to a practical pattern formation process, the trench structure 20 may be formed by an inkjet printing device in which several nozzles are arranged at predetermined intervals.

Next, when the trench structure 20 is formed on the dopant layer 15, the trench structure 20 may be etched. In this case, the etching of the dopant layer 15 may be performed by an etching method commonly known in the technical field to which the present disclosure pertains, for example, a wet etching method, a dry etching method or the like. More specifically, the etching of the dopant layer 15 may be performed by a method of treating the substrate 10 and the dopant layer 15 formed on the substrate 10, using a mixture solution containing $HF:HNO_3:H_2O$ in a volume ratio of 1:(10 to 100):(10 to 50).

In addition, the etching of the dopant layer 15 may include a cleaning process and a drying process. For example, after the etching of the dopant layer 15, the substrate 10 on which the trench structure 20 is formed may be treated in the mixture solution for 1 minute, be cleaned 3 times to 5 times using ultrapure water, and then, be dried using a nitrogen gun.

Meanwhile, the method of manufacturing a solar battery according to an exemplary embodiment of the present disclosure may further include forming a reflection prevention layer on the substrate 10. In this case, the reflection prevention layer may be formed on an exposed surface exposed in accordance with the etching of the dopant layer 15 (not shown). The reflection prevention layer may be a silicon nitride film, a silicon nitride film containing hydrogen, a silicon oxide film, a silicon oxynitride film or a material film containing one or more selected from a group consisting of magnesium fluoride ($MgF_2$), zinc sulfide (ZnS), titanium dioxide ($TiO_2$), and cerium oxide ($CeO_2$). The reflection prevention layer may be formed of a single layer or may have a multilayer structure in which two or more layers are combined with each other. Meanwhile, the reflective prevention layer may be formed by a vacuum deposition method, a chemical vapor deposition, a spin coating method, a screen printing method or a spray coating method.

Next, after the etching of the dopant layer 15, the interior portion of the trench structure 20 may be filled with the filler 30. A method of filling the interior portion of the trench structure 20 with the filler 30 may be performed by a sputtering method, as well as various printing methods such as a screen printing method, an inkjet printing method, a dispensing method and the like, which are generally used, as described above.

Meanwhile, as the filler 30 filling the interior portion of the trench structure 20, various types of materials may be used depending on the field of application without limitations, as long as they allow the solvent of the filler to be dried at a temperature lower than the melting point of the hot melt ink used in the forming of the trench structure 20. For example, the filler 30 may include a conductive material containing one or more selected from a group consisting of silver (Ag), copper (Cu), aluminum (Al), indium tin oxide (ITO), gold (Au), nickel (Ni), carbon nanotubes(CNT) and poly(3,4-ethylenedioxythiophene) (PEDOT).

Next, after filling the interior portion of the trench structure 20 with the filler 30, the trench structure 20 may be removed. Through the removal process of the trench structure 20, the electrode 40' may be obtained on the dopant layer 15. In a similar manner to those as described above, the removal process of the trench structure 20 may include one or more selected from a group consisting of a thermal treatment process and a solution treatment process, and a detailed description thereof is identical to that described above.

Meanwhile, an exemplary embodiment of the present disclosure may also provide a solar battery formed by the method of manufacturing a solar battery. In this case, the electrode 40' may have a high aspect ratio or may be formed of a fine pattern. In this case, efficiency of the solar battery may be improved by increasing an area of a light receiving unit receiving light.

The solar battery may include a p-type semiconductor and an n-type semiconductor. In a case in which the solar battery absorbs solar energy from a photoactive layer thereof, electron-hole pairs (EHPs) may be generated in the interiors of the semiconductors and correspondingly generated electrons and holes may move to the n-type semiconductor and the p-type semiconductor, respectively. The elements may be collected in the electrode 40', to thereby be used as external electrical energy. In the case of the solar battery, an increase in the efficiency thereof may be important, such that as high an amount of electrical power as possible may be output from solar energy. In order to increase the efficiency of the solar energy, it may be important to generate electron-hole pairs as much as possible, but it may be also important to reduce loss in generated charges, thereby spreading electrical energy outwardly.

MODE FOR DISCLOSURE

Hereinafter, the present disclosure will be described in detail through examples. However, the present disclosure is not limited thereto.

Inventive Example 1

After injecting a thermoplastic hot melt type ink into a reservoir, a temperature of the reservoir was set to 85° C., and then, a jetting operation was performed. The jetting operation was conducted by all of 128 nozzles with a voltage of 65V applied thereto using a SE-128 head (manufactured by Dimatix, Inc). As a substrate, a silicon substrate having unevenness was used. On the silicon substrate having unevenness, printing patterns having a line width of about 30 μm and a height of about 20 μm were jetted one time at pitch intervals of 30 μm to thereby form a bottom surface. The bottom surface had 7 lines of the printing patterns and the substrate was completely covered so as not to form a void such as a pin hole between the printing patterns. A total width of the bottom surface was about 200 μm and a thickness thereof was about 20 μm. Thereafter, the jetting operation was performed one time on respective first, second, sixth and seventh printing patterns among the printing patterns configuring the bottom surface, to thereby form wall surfaces. By doing so, a trench structure in which the number of lines of the printing patterns configuring the bottom surface was 7 and the number of layers of the printing patterns configuring the wall surfaces was 2, was formed on the substrate. An internal width of the bottom surface of the trench structure was about 100 μm and an internal height of the wall surfaces of the trench structure was about 20 μm.

After a silver nano-ink containing a solid amount of 50 wt % was jetted at pitch intervals of 20 μm in the trench structure, using a nozzle of 50 μm by utilizing Unijet equipment, a drying process was conducted 6 times at room temperature. The trench structure filled with the filler was thermally treated at an oven of 350° C. to 500° C. within 5 minutes to 2 hours, thereby removing the trench structure.

A line width of an accordingly formed pattern was about 100 μm, a thickness of the pattern was about 20 μm, and an aspect ratio of the pattern was about 5:1.

Inventive Example 2

After forming a bottom surface having 7 lines of printing patterns in the same manner as the case of Inventive Example 1, a jetting operation was performed three times on respective first, second, sixth and seventh printing patterns among the printing patterns configuring the bottom surface, to thereby form wall surfaces. By doing so, a trench structure in which the number of lines of the printing patterns configuring the bottom surface was 7 and the number of layers of the printing patterns configuring the wall surfaces was 3, was formed on a substrate. An internal width of the bottom surface of the trench structure was about 100 μm and an internal height of the wall surfaces of the trench structure was about 60 μm.

Thereafter, processes of filling the interior portion of the trench structure with filler and removing the trench structure were applied in the same manner to those of Inventive Example 1. A line width of an accordingly formed pattern was about 100 μm, a thickness of the pattern was about 60 μm, and an aspect ratio of the pattern was about 5:3.

Inventive Example 3

After forming a bottom surface having 7 lines of printing patterns in the same manner as the case of Inventive Example 1, a jetting operation was performed five times on respective first, second, sixth and seventh printing patterns among the printing patterns configuring the bottom surface, to thereby form wall surfaces. By doing so, a trench structure in which the number of lines of the printing patterns configuring the bottom surface was 7 and the number of layers of the printing patterns configuring the wall surfaces was 5, was formed on a substrate. An internal width of the bottom surface of the trench structure was about 100 μm and an internal height of the wall surfaces of the trench structure was about 100 μm.

Thereafter, processes of filling the interior portion of the trench structure with filler and removing the trench structure were applied in the same manner to those of Inventive Example 1. A line width of an accordingly formed pattern was about 100 μm, a thickness of the pattern was about 100 μm, and an aspect ratio of the pattern was about 1:1.

Figure 6:
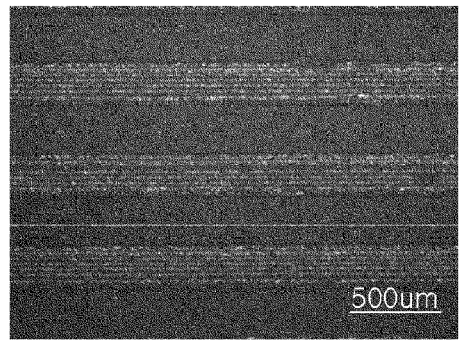
FIGS. 6(*a*), 6(*b*) and 6(*c*) are optical images obtained by imaging trench structures formed according to Inventive Example 1, Inventive Example 2 and Inventive Example 3, the above.
Figure 6:
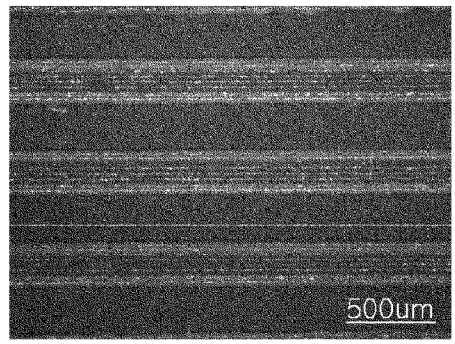
Figure 6:
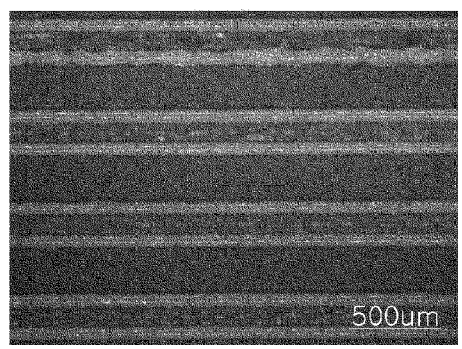

Meanwhile, optical images obtained by imaging the trench structures formed according to Inventive Examples 1 to 3, from above, are illustrated in FIG. 6. As can be seen in FIGS. 6(a) to 6(c), in a case in which the number of layers of the printing patterns was increased, a color contrast between the bottom surface and the wall surfaces of the trench structure was apparent and accordingly, it could be confirmed that even when the number of layers of the printing patterns was increased, a shape of trench structure did not collapse and was securely formed.

Comparative Example 1

A silver nano ink containing a solid amount of 50 wt % was jetted from a DMP2800 inkjet device and in this case, a liquid droplet of 10 pl per nozzle was ejected.

Figure 7:
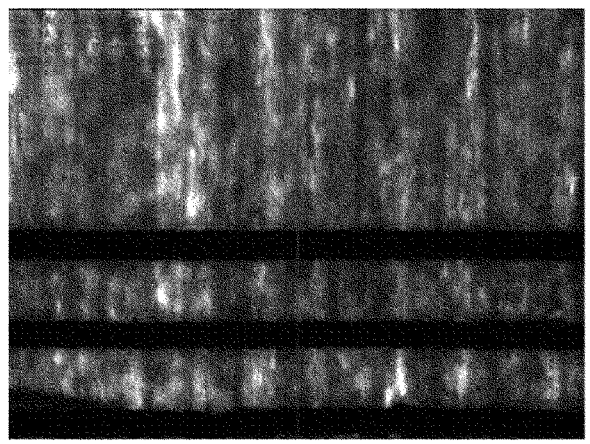
FIG. 7 is an optical image of a pattern formed according to Comparative Example 1.

A jetting operation was undertaken at pitch intervals of 20 μm on a glass substrate, a surface of which has not been treated. A line width of an accordingly formed linear pattern was about 110 μm to 114 μm, a thickness of the linear pattern was about 0.4 μm to 0.7 μm, and an aspect ratio of the linear pattern was about 275:1. An optical image of the formed pattern is illustrated in FIG. 7. Black portions of FIG. 7 correspond to the formed pattern. In a view of the left lower portion of FIG. 7, it could be confirmed that a spreading phenomenon of the ink was observed.

Comparative Example 2

Figure 8:
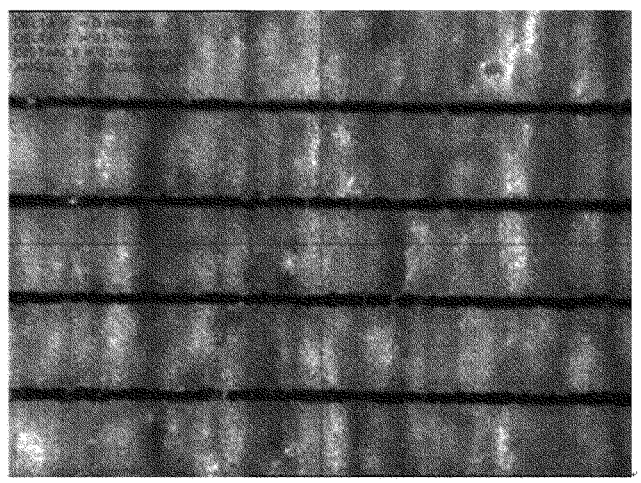
FIG. 8 is an optical image of a pattern formed according to Comparative Example 2.

A surface treatment was performed on a glass substrate by performing a spin coating method using a mixture solution in which a cellulose solution and a surfactant were mixed with each other. With the exception that the surface-treated substrate was used as described above, a jetting operation performed under the same conditions as those of Comparative Example 1. As a result, a line width of an accordingly formed linear pattern was about 43 μm, a thickness of the linear pattern was about 1.5 μm, and an aspect ratio of the linear pattern was about 28.7:1. An optical image of the formed pattern is illustrated in FIG. 8. Black portions of FIG. 8 correspond to the formed pattern. As compared to Comparative Example 1 (FIG. 7), it could be confirmed that the line width of the pattern was narrow. Although the pattern of Comparative Example 2 had a high aspect ratio as compared to the case of Comparative Example 1, the pattern of Comparative Example 2 had a significantly low aspect ratio as compared to the patterns of the Inventive Examples.

Experimental Example 1

Measurement of Shapes of Trench Structures Using Optical Profiler

Figure 9:
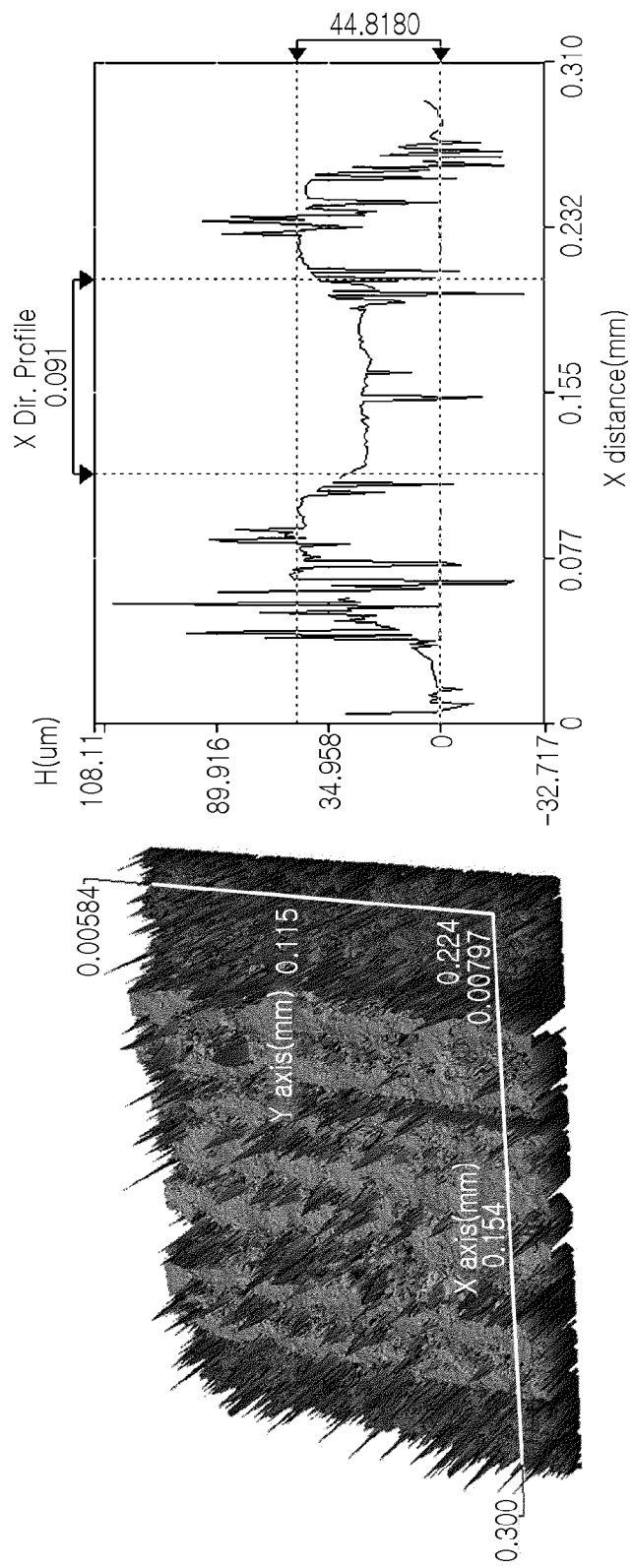
FIGS. 9, 10, and 11 are 3-D optical images obtained by measuring the trench structures formed according to Inventive Example 1, Inventive Example 2 and Inventive Example 3, using an optical profiler.
Figure 10:
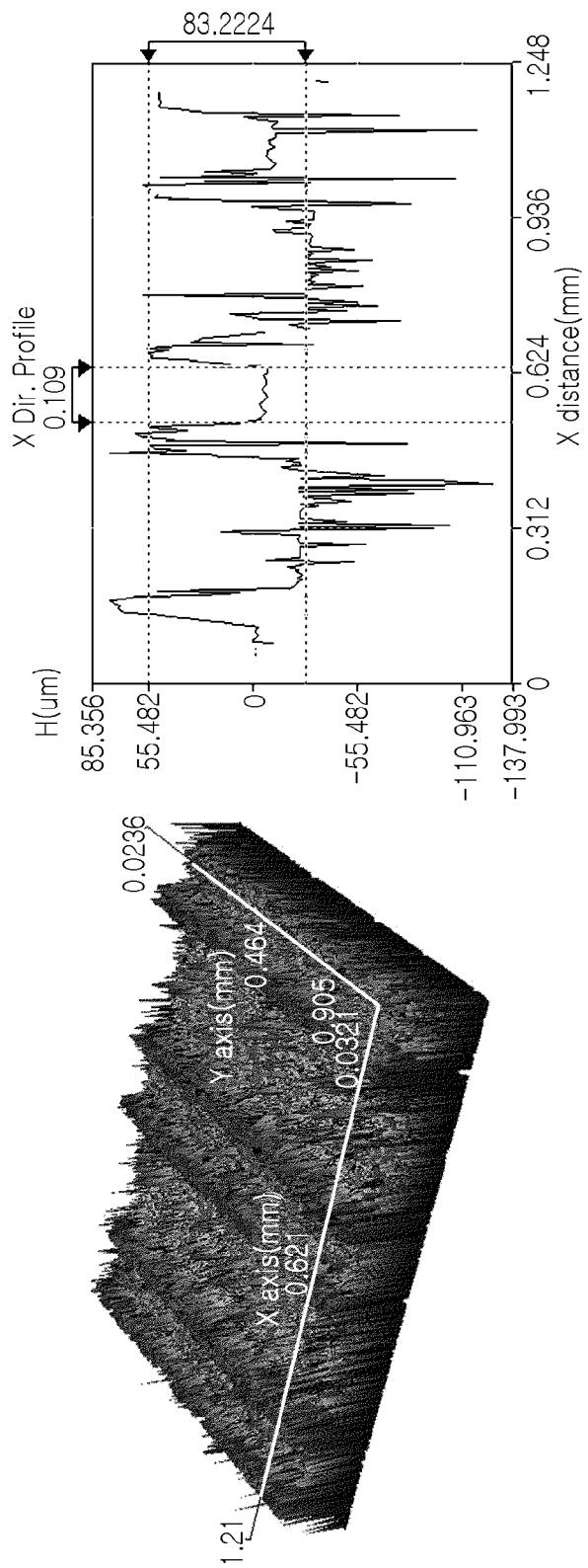
Figure 11:
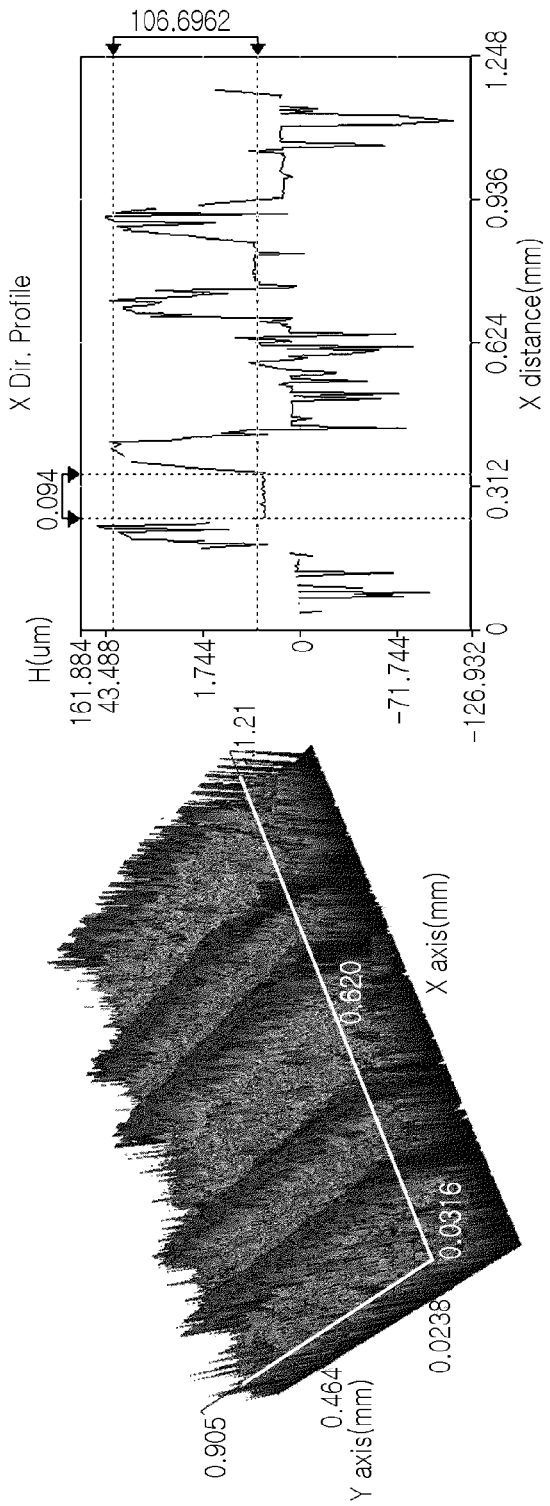

The trench structures formed by the same method as Inventive Examples 1 to 3 were measured using an optical profiler, and results thereof are illustrated in FIGS. 9 to 11. FIG. 9 illustrates a state in which a single trench structure is formed on a substrate according to the method of Inventive Example 1. FIG. 10 illustrates a state in which two trench structures are formed on a substrate to be adjacent to each other according to the method of Inventive Example 2. FIG. 11 illustrates a state in which two trench structures are formed on a substrate to be adjacent to each other according to the method of Inventive Example 3. Comparing measured values of the trench structures according to Inventive Examples 1 to 3 and FIGS. 9 to 11, differences in measured values between the trench structures were generated within a certain range. This is due to an error in measurement caused at the time of performing measurement using the optical profiler. In this case, in FIGS. 9 to 11, left side views illustrate three-dimensional shapes. Here, X-axis and Y-axis units are mm and z-axis unit is µm. In addition, right side views illustrate profiles of surfaces cut in a direction perpendicular to Y-axis. Meanwhile, three views of FIGS. 9 to 11 are compared with one another, such that variations in widths and heights of toughs in the trench structures could be confirmed.

Experimental Example 2

Shapes of Trench Structures Measured by Alpha Step Method

Figure 12:
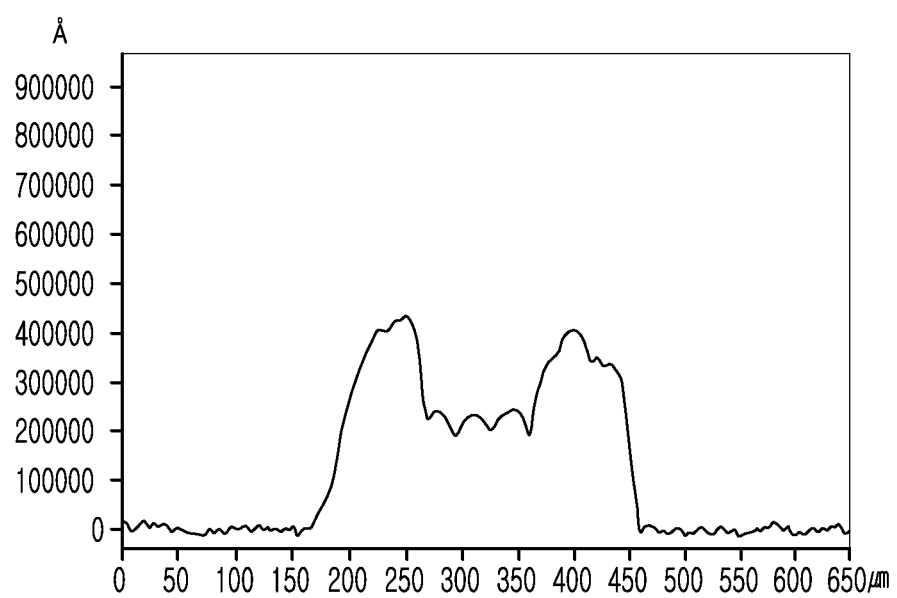
FIG. 12 is a graph illustrating results obtained by measuring the trench structure formed according to Inventive Example 1 using an alpha step method.

The trench structure formed according to Inventive Example 1 was measured by the alpha step method and results thereof are illustrated in FIG. 12. According to FIG. 12, a height of the trench structure was about 40 µm, a height of the trough of the trench structure was about 20 µm, and a width of the trough was about 90 µm to 100 µm.

EXPLANATION OF REFERENCE NUMERAL

2: Printing patterns for forming a trench structure
10: Substrate
15: Dopant layer
20: Trench structure
30: Filler
40: Pattern
40': Electrode
W: Internal width of trench structure
T: Internal thickness of trench structure

The invention claimed is:
1. A method of manufacturing a pattern, comprising:
forming a trench structure including a wall surface on a substrate;
filling an interior portion of the trench structure with a filler; and
removing the trench structure,
wherein the trench structure is formed by an inkjet method, using hot melt ink, and
wherein the wall surface is composed of a plurality of printing patterns which are overlapped and formed on another printing pattern.
2. The method of claim 1, wherein a ratio of an internal height to an internal width of the trench structure is 6:1 to 1:10.
3. The method of claim 1, wherein the hot melt ink is a thermoplastic hot melt ink or an UV curable hot melt ink.
4. The method of claim 1, wherein the filler includes a conductive material containing one or more selected from a group consisting of silver (Ag), copper (Cu), aluminum (Al), indium tin oxide (ITO), gold (Au), nickel (Ni), carbon nanotubes (CNT) and poly(3,4-ethylenedioxythiophene) (PEDOT), or an insulating material containing one or more selected from a group consisting of acrylate, urethane, polyimide and epoxy resin.
5. The method of claim 1, wherein the removing of the trench structure includes one or more selected from a group consisting of a thermal treatment process and a solution treatment process.
6. A pattern manufactured by the method of claim 1.
7. A method of manufacturing a solar battery, comprising:
forming a dopant layer on a substrate;
forming a trench structure including a wall surface on the dopant layer;
etching the dopant layer;
filling an interior portion of the trench structure with a filler; and
removing the trench structure,
wherein the trench structure is formed by an inkjet method, using hot melt ink, and
wherein the wall surface is composed of a plurality of printing patterns which are overlapped and formed on another printing pattern.
8. The method of claim 7, wherein a ratio of an internal height to an internal width of the trench structure is 6:1 to 1:10.
9. The method of claim 7, wherein the hot melt ink is a thermoplastic hot melt ink or an UV curable hot melt ink.
10. The method of claim 7, wherein the substrate is a silicon wafer.
11. The method of claim 7, wherein the filler includes a conductive material containing one or more selected from a group consisting of silver(Ag), copper(Cu), aluminum(Al), indium tin oxide(ITO), gold(Au), nickel(Ni), carbon nanotubes(CNT) and poly(3,4-ethylenedioxythiophene)(PEDOT).
12. The method of claim 7, further comprising: forming a reflection prevention layer on the substrate, after the etching of the dopant layer.
13. A solar battery manufactured by the method of claim 7.

* * * * *